(12) United States Patent
Hung et al.

(10) Patent No.: US 10,971,475 B2
(45) Date of Patent: Apr. 6, 2021

(54) SEMICONDUCTOR PACKAGE STRUCTURE

(71) Applicant: TAIWAN SEMICONDUCTOR MANUFACTURING COMPANY LTD., Hsinchu (TW)

(72) Inventors: Jeng-Nan Hung, Taichung (TW);
Chun-Hui Yu, Hsinchu County (TW);
Kuo-Chung Yee, Taoyuan County (TW); Yi-Da Tsai, Chiayi Country (TW); Wei-Hung Lin, Hsinchu County (TW); Ming-Da Cheng, Taoyuan (TW);
Ching-Hua Hsieh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/533,569

(22) Filed: Aug. 6, 2019

(65) Prior Publication Data

US 2019/0363066 A1 Nov. 28, 2019

Related U.S. Application Data

(62) Division of application No. 15/441,901, filed on Feb. 24, 2017, now Pat. No. 10,373,931.

(Continued)

(51) Int. Cl.
*H01L 23/29* (2006.01)
*H01L 25/065* (2006.01)
(Continued)

(52) U.S. Cl.
CPC .......... *H01L 25/0652* (2013.01); *H01L 21/56* (2013.01); *H01L 21/565* (2013.01); *H01L 21/568* (2013.01); *H01L 23/3107* (2013.01);
*H01L 24/20* (2013.01); *H01L 24/32* (2013.01);
*H01L 24/73* (2013.01); *H01L 25/50* (2013.01);
*H01L 21/561* (2013.01); *H01L 21/566* (2013.01); *H01L 23/295* (2013.01); *H01L 2224/32145* (2013.01); *H01L 2224/73267* (2013.01); *H01L 2225/06524* (2013.01); *H01L 2225/06527* (2013.01); *H01L 2225/06548* (2013.01); *H01L 2225/06562* (2013.01); *H01L 2225/06586* (2013.01); *H01L 2924/05432* (2013.01); *H01L 2924/05442* (2013.01); *H01L 2924/0665* (2013.01); *H01L 2924/186* (2013.01)

(58) Field of Classification Search
CPC combination set(s) only.
See application file for complete search history.

(56) References Cited

U.S. PATENT DOCUMENTS

| 2007/0131952 A1* | 6/2007 | Huang | H01L 33/0093 257/94 |
| 2015/0036970 A1* | 2/2015 | Lai | H01L 24/20 385/14 |
| 2016/0315071 A1* | 10/2016 | Zhai | H01L 24/24 |

* cited by examiner

*Primary Examiner* — Moin M Rahman
(74) *Attorney, Agent, or Firm* — WPAT, P.C., Intellectual Property Attorneys; Anthony King

(57) ABSTRACT

A semiconductor package structure includes a plurality of first dies spaced from each other, a molding layer between the first dies, a second die over the plurality of first dies and the molding layer, and an adhesive layer between the plurality of first dies and the second die, and between the molding layer and the second die. A first interface between the adhesive layer and the molding layer and a second interface between the adhesive layer and the plurality of first dies are at different levels.

20 Claims, 21 Drawing Sheets

Related U.S. Application Data

(60) Provisional application No. 62/427,664, filed on Nov. 29, 2016.

(51) Int. Cl.
*H01L 21/56* (2006.01)
*H01L 23/31* (2006.01)
*H01L 23/00* (2006.01)
*H01L 25/00* (2006.01)

SEMICONDUCTOR PACKAGE STRUCTURE

CROSS REFERENCE TO RELATED APPLICATIONS

This application is a divisional application of application Ser. No. 15/441,901 filed on Feb. 24, 2017, now allowed, which claims priority of U.S. provisional application Ser. No. 62/427,664 filed on 29 Nov. 2016. All of the above-referenced applications are hereby incorporated by reference in their entirety.

BACKGROUND

In an attempt to further increase circuit density and reduce costs, three-dimensional (3D) semiconductor package structures have been developed. In a semiconductor package structure, several dies are stacked and molding layers are formed to encapsulate the stacked dies. For a semiconductor package structure with a channel among the dies, however, void tends to occur in the channel in formation of the molding layer, and several molding operations are required.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
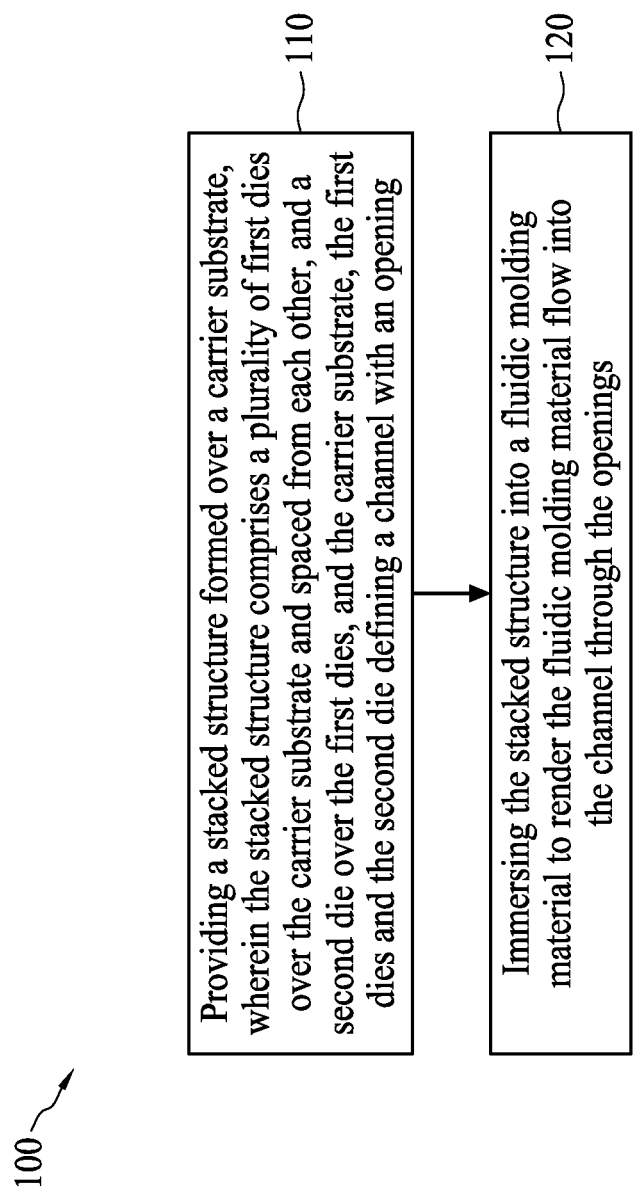
FIG. 1 is a flow chart illustrating a method for manufacturing a semiconductor package structure according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

In one or more embodiments of the present disclosure, a method of manufacturing semiconductor package structure is provided. The method includes forming a molding layer in a channel by an immersion molding operation. The channel is narrow passage with small openings defined by several stacked dies. In the immersion molding operation, the channel having openings is gradually immersed in a fluidic molding material such that the fluidic molding material is steadily flowed into the channel through the openings. Meanwhile, residual air in the channel is carried off through the openings of the channel. Accordingly, formation of void in the channel is alleviated. The fluidic molding material is then cured to form the molding layer. In some embodiments, the immersion molding operation is carried out in a reaction chamber being vacuumed such that residual air is carried off by vacuum.

In one or more embodiments of the present disclosure, a method of manufacturing a channel structure is provided. The method includes disposing a channel structure having a channel with an opening into a fluidic material to render the fluidic material flow into the channel through the opening. The channel is disposed in the fluidic material at a first depth such that a first portion of the opening is immersed into the fluidic material, while a second portion of the opening is exposed from the fluidic material. Accordingly, residual air in the channel is carried off through the second portion of the opening of the channel. The channel is then disposed in the fluidic material at a second depth such that the second portion of the opening is immersed into the fluidic material to render the fluidic material flow into the channel. In one or more embodiments, the channel structure is, but not limited to, a portion of a semiconductor package structure having a channel with opening(s).

In one or more embodiments of the present disclosure, a semiconductor package structure includes first dies spaced from each other, a molding layer between first dies, a second die over the first dies and the molding layer, and an adhesive layer between the first dies and the second die and between the molding layer and the second die. The molding layer includes a protrusion portion extending toward the second die or a recessed portion recessed away from the second die such that the molding layer is engaged with the adhesive layer, thereby enhancing adhesion between the molding layer and the adhesive layer.

FIG. 1 is a flow chart illustrating a method for manufacturing a semiconductor package structure according to various aspects of one or more embodiments of the present disclosure. The method 100 begins with operation 110 in which a stacked structure formed over a carrier substrate is provided. The stacked structure comprises a plurality of first dies over the carrier substrate and spaced from each other, and a second die over the first dies, and the carrier substrate, the first dies and the second die define a channel with an opening. The method 100 proceeds with operation 120 in which the stacked structure is immersed into a fluidic molding material to render the fluidic molding material flow into the channel through the openings.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2:
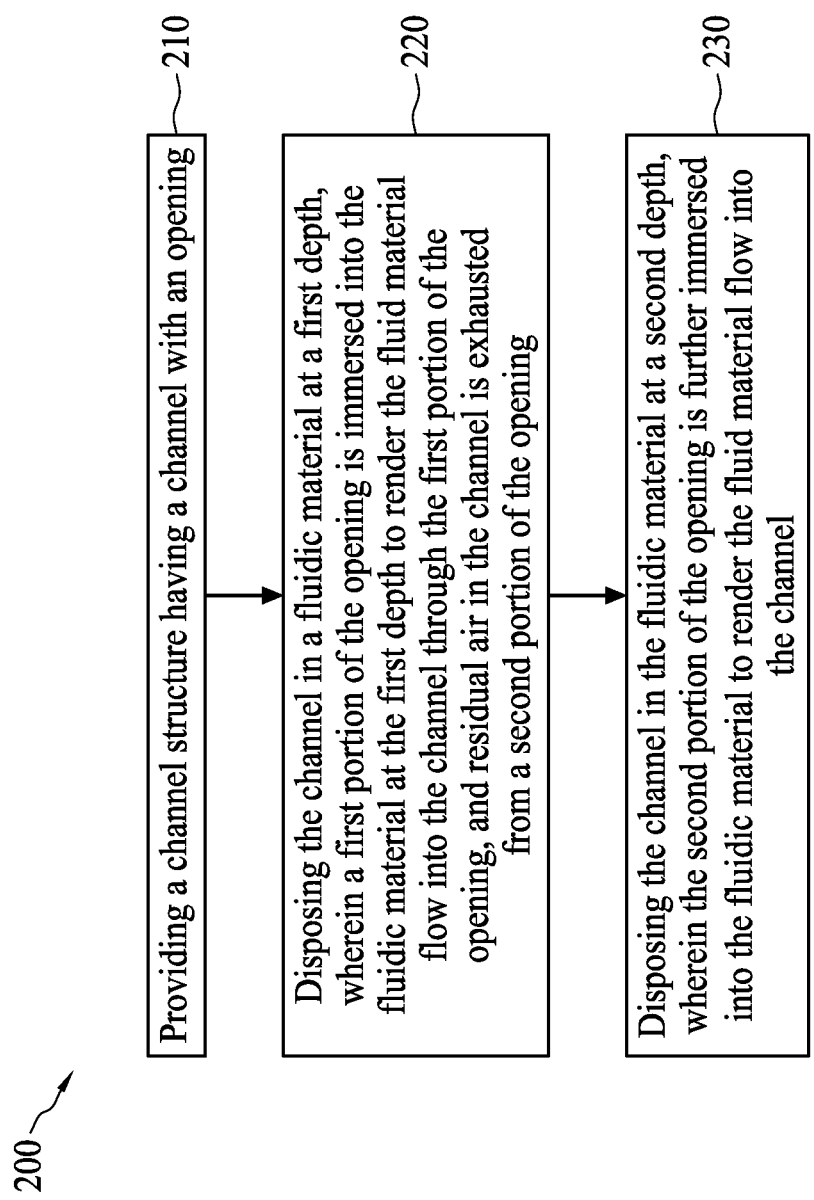
FIG. 2 is a flow chart illustrating a method for manufacturing a channel structure according to various aspects of one or more embodiments of the present disclosure.

FIG. 2 is a flow chart illustrating a method for manufacturing a channel structure according to various aspects of one or more embodiments of the present disclosure. The method 200 begins with operation 210 in which a channel structure having a channel with an opening is provided. The method 200 continues with operation 220 in which the channel is disposed in a fluidic material at a first depth. In operation 220, a first portion of the opening is immersed into the fluidic material at the first depth to render the fluidic material flow into the channel through the first portion of the opening, and residual air in the channel is exhausted from a second portion of the opening. The method 200 proceeds with operation 230 in which the channel is disposed in the fluidic material at a second depth. In operation 230, the second portion of the opening is further immersed into the fluidic material to render the fluidic material flow into the channel.

The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

Figure 3A:
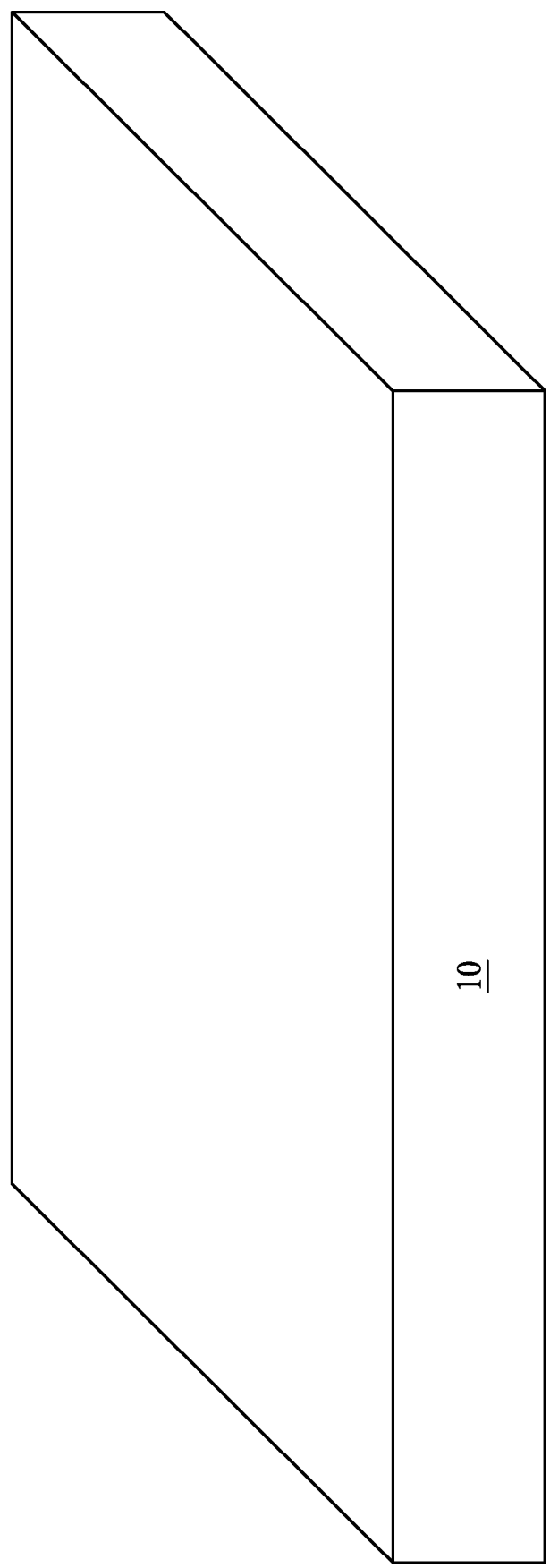
FIG. 3A, FIG. 3B, FIG. 3C, FIG. 3D, FIG. 3E, FIG. 3F, FIG. 3G, FIG. 3H and FIG. 3I are schematic views at one of various operations of manufacturing a semiconductor package structure according to one or more embodiments of the present disclosure.
Figure 3B:
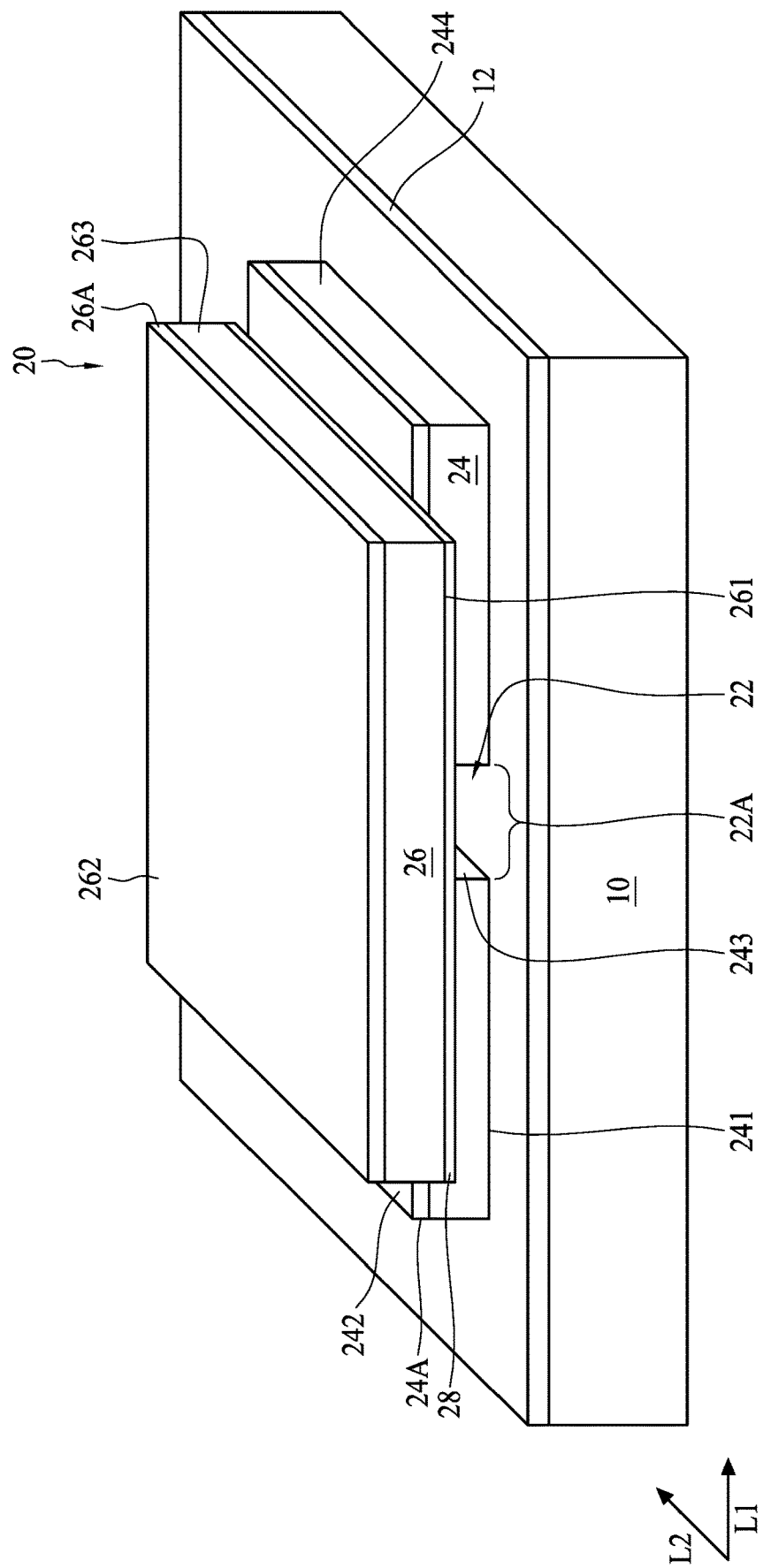

FIG. 3A, FIG. 3B, FIG. 3C, FIG. 3D, FIG. 3E, FIG. 3F, FIG. 3G, FIG. 3H and FIG. 3I are schematic views at one of various operations of manufacturing a semiconductor package structure according to one or more embodiments of the present disclosure, where FIG. 3A and FIG. 3B are perspective views, and FIG. 3C, FIG. 3D, FIG. 3E, FIG. 3F, FIG. 3G, FIGS. 3H and 3I are cross-sectional views. As depicted in FIG. 3A, a carrier substrate 10 is provided. The carrier substrate 10 is configured as a carrier for carrying a channel structure having a channel with opening(s) during manufacturing, and is able to be handled by a carrier holder. In one or more embodiments, the channel structure is a part of a stacked structure such as a semiconductor package structure. In one or more embodiments, the carrier substrate 10 is, but not limited to, a glass carrier substrate. The carrier substrate 10 may be formed from insulative material, semiconductive material, conductive material or any other suitable material.

Figure 3C:
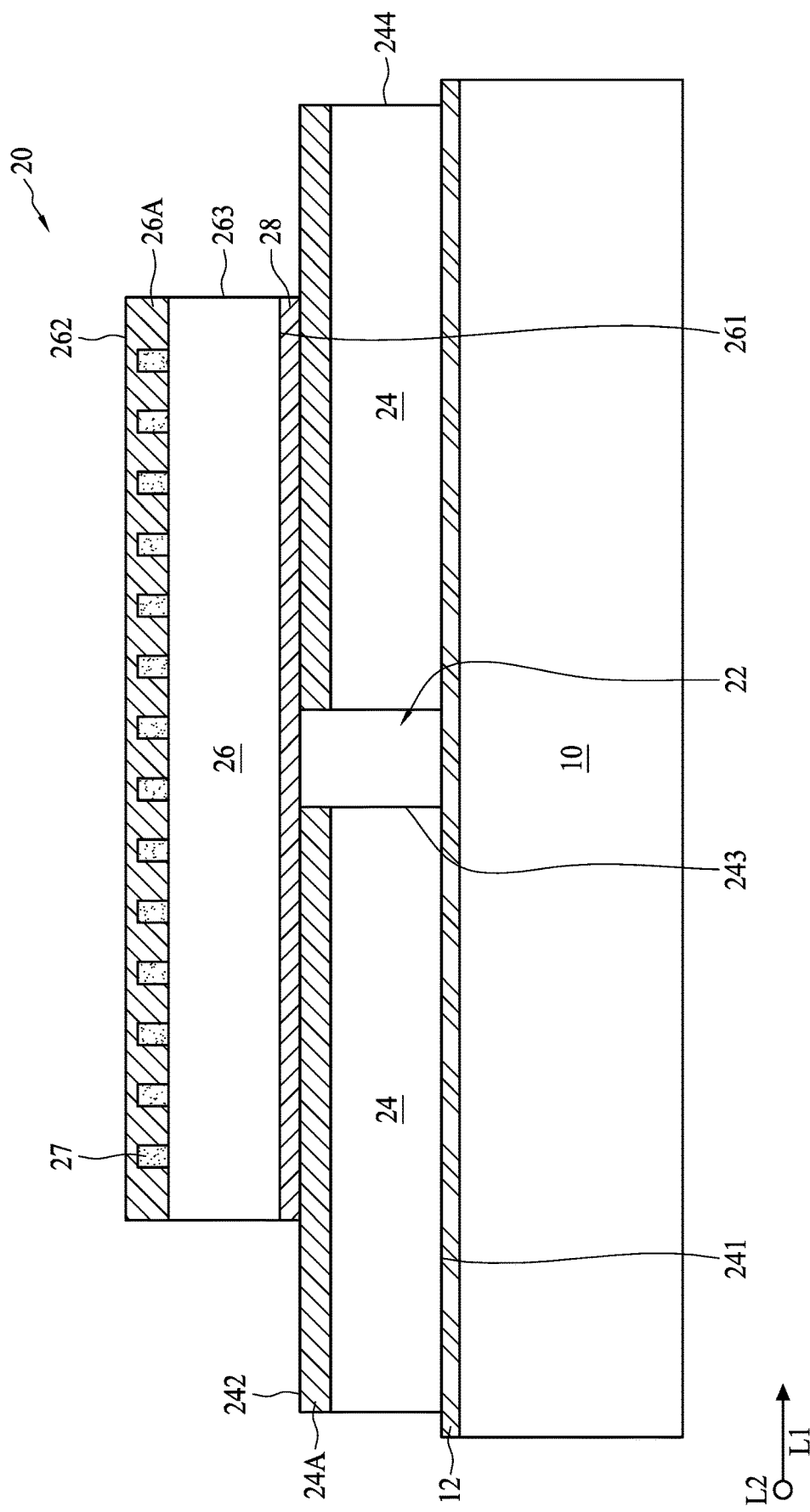

As depicted in FIGS. 3B and 3C, a stacked structure 20 formed over the carrier substrate 10 is provided. The stacked structure 20 includes a plurality of first dies 24 and a second die 26. The first dies 24 are disposed over the carrier substrate 10 and spaced from each other, and a second die 26 disposed over the first dies 24. The carrier substrate 10, the first dies 24 and the second die 26 define a channel 22 with at least two openings 22A. In one or more embodiments, the stacked structure 20 includes several first dies 24 laterally disposed over the carrier substrate 10 in a first direction L1. The channel 22 is an empty gap extending along a second direction L2 between adjacent first dies 24 with openings 22A facing the second direction L2. In one or more embodiments, two first dies 24 are arranged side by side over the carrier substrate 10 in the first direction L1, and the channel 22 is substantially a straight channel with two openings 22A. In some embodiments, two or more first dies 24 may be arranged in a different manner such that the channel 22 may have a different shape such as straight channel with one opening, a T-shaped channel with three openings, a cross-shaped channel with four openings or channels with other shapes. In one or more embodiments, a first surface (e.g. a bottom surface) 241 of the first die 24 is formed over the carrier substrate 10 with an adhesive layer 12 such as a die attaching film (DAF). The first dies 24 may be semiconductor dies or any other types of dies, package structures or interposers. In one or more embodiments, a second surface 242 (e.g. an upper surface) of the first die 24 is a structural layer 24A. The structural layer 24A may be an upmost layer of the first die 24. By way of example, the structural layer 24A is, but not limited to, an upmost layer of a redistribution layer (RDL), an upmost passivation layer or other insulative or conductive layer of the first die 24. In one or more embodiments, the material of the structural layer 24A is a polymeric material such as polyimide (PI) or polybenzoxazole (PBO). In some embodiments, the first dies 24 and the second die 26 are electrically connected to each other. Conductors such as through insulator vias (TIVs) (not shown) are disposed over the structural layer 24A of the first die 24 and arranged alongside the second die 26. The conductors are configured to electrically connect the first die 24 to an electronic structure such as a redistribution layer, a package structure, a circuit board or the like disposed over the second die 26. In some embodiments, the first die 24 is electrically connected to the second die 26 through the electronic structure.

The second die 26 is positioned over the laterally disposed first dies 24. In one or more embodiments, a first surface (e.g. a bottom surface) 261 of the second die 26 is formed over the second surfaces 242 of the first dies 24 with another adhesive layer 28 such as a die attaching film (DAF). The second die 26 also covers the channel 22 such that the carrier substrate 10, the first dies 24 and the second die 26 define the channel 22 with openings 22A. In one or more embodiments, the openings 22A are defined by an inner sidewall 243 of each first die 24, the first surface 261 and a surface of the adhesive layer 12. In some embodiments, the openings 22A face the second direction L2 substantially orthogonal to the first direction L1, along which the first dies 24 are disposed. The second die 26 may be a semiconductor die or any other types of die or package structure. The dimension of the first die 24 or the second die 26 may be arbitrarily increased or reduced. In some embodiments, the dimension of the second die 26 is larger than the dimension of the first die 24. In some alternative embodiments, the dimension of the second die 26 is smaller than the dimension of the first die 24.

In one or more embodiments, a second surface 262 (e.g. an upper surface) of the second die 26 is a structural layer 26A. By way of example, the structural layer 26A is, but not limited to, an upmost layer of a redistribution layer (RDL), an upmost passivation layer or other insulative layer of the second die 26. In one or more embodiments, the material of the structural layer 26A is a polymeric material such as polyimide (PI) or polybenzoxazole (PBO). In one or more embodiments, conductors 27 such as conductive pillars or bonding pads are disposed proximal to the second surface 262 of the second die 26, and the conductors 27 are configured to electrically connect the second die 26 to an electronic structure such as a redistribution layer, a package structure, a circuit board or the like. In some embodiments, the second die 26 is electrically connected to the first die 24 through the electronic structure. In some embodiments, the conductors 27 are covered by the upmost structural layer 26A.

Figure 3D:
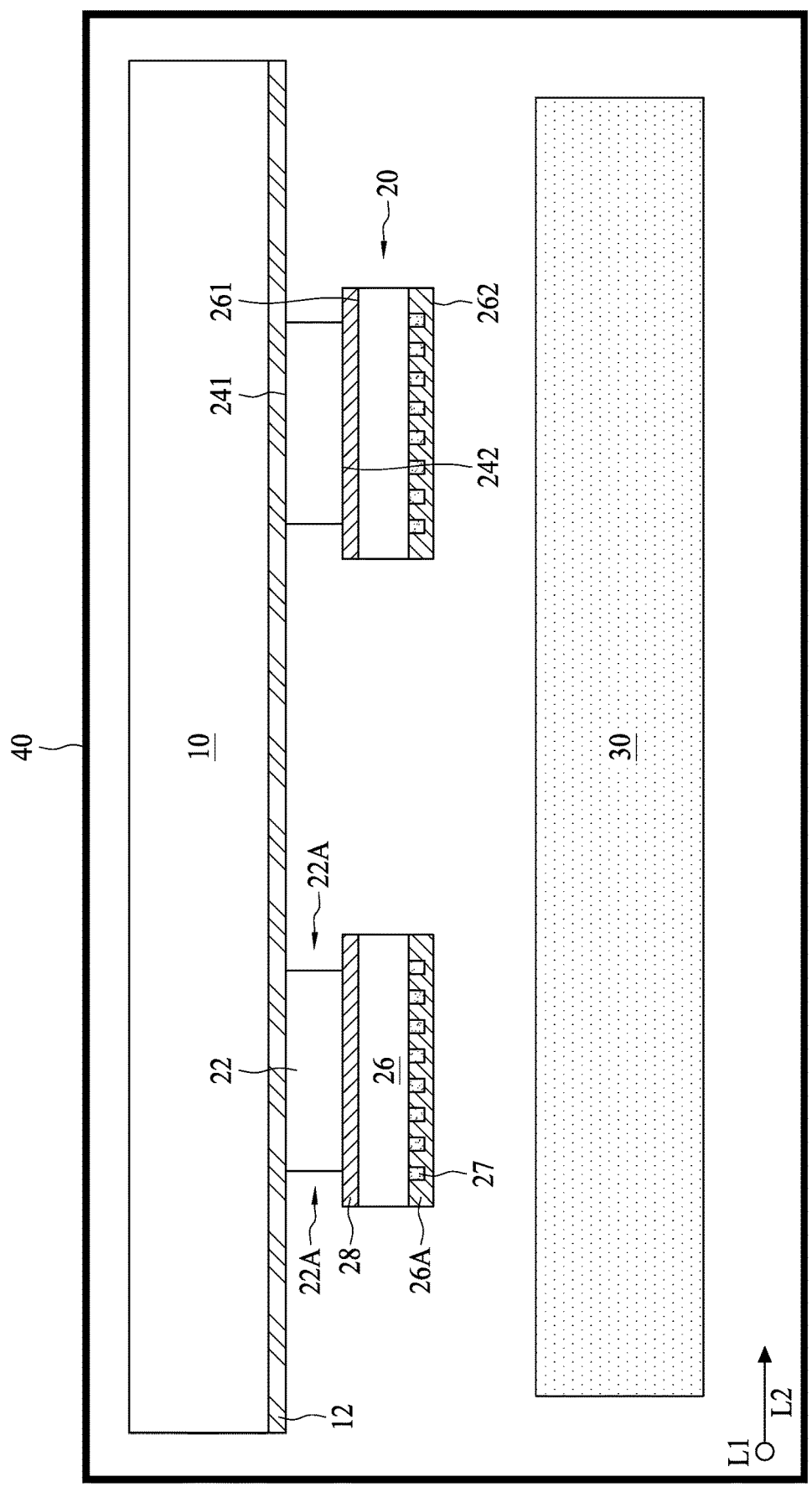

As depicted in FIG. 3D, a fluidic material such as a fluidic molding material 30 is provided. In one or more embodiments, the fluidic molding material 30 is an insulative material in a fluidic form. By way of example, the insulative material is a polymeric material such as, but not limited to, epoxy resin. In some embodiments, the fluidic molding material 30 includes fillers such as silicon oxide filler or aluminum oxide fillers containing in the fluid. The stacked structure 20 adhered to the carrier substrate 10 is turned over such that the stacked structure 20 faces the fluidic molding material. In one or more embodiments, the fluidic molding material 30 and the stacked structure 20 are loaded in a reaction chamber 40. In one or more embodiments, the reaction chamber 40 is configured to provide a heated environment. In one or more embodiments, the reaction chamber 40 is configured to provide a vacuum environment.

Figure 3E:
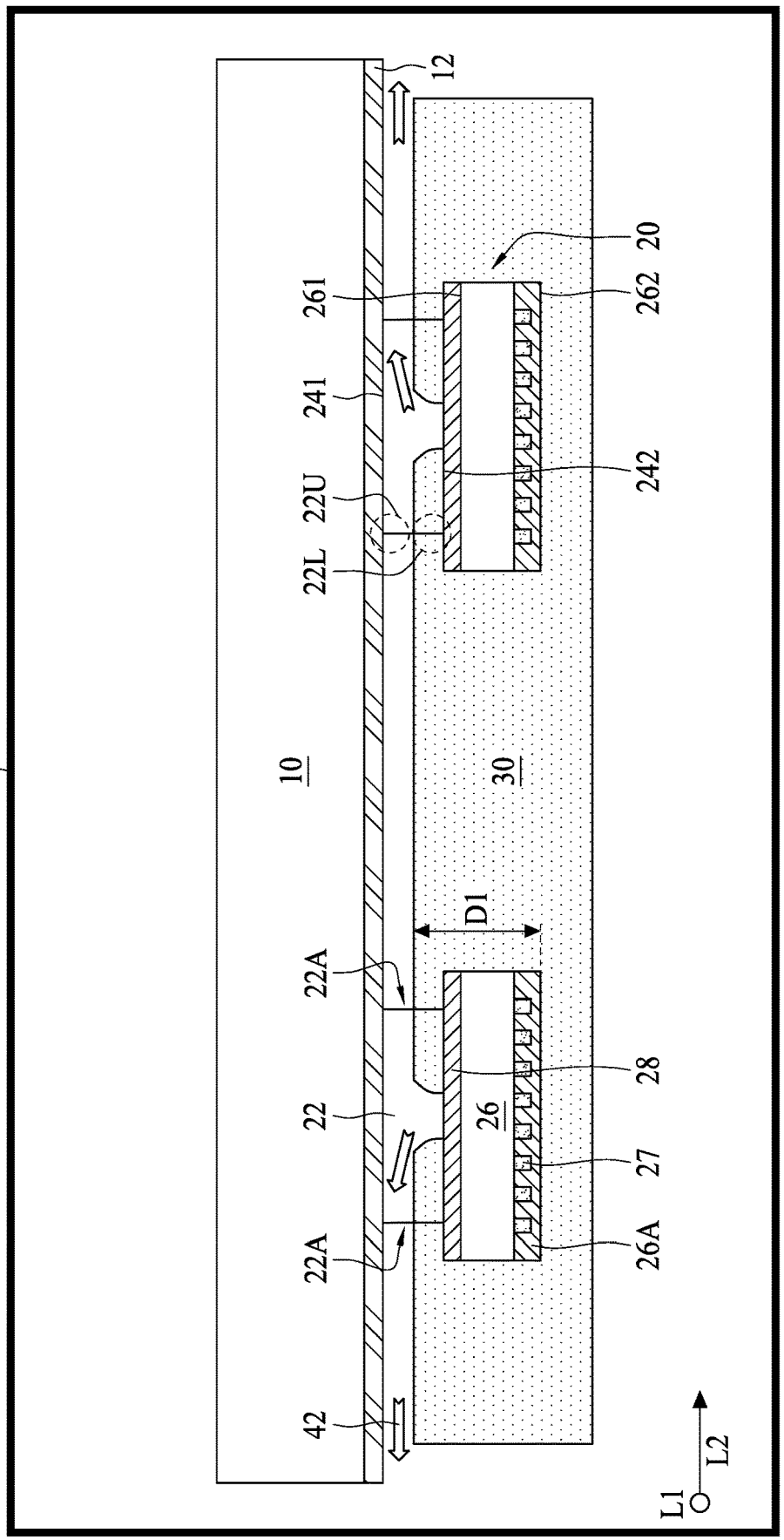

As depicted in FIG. 3E, the stacked structure 20 is immersed into the fluidic molding material 30 to render the fluidic molding material 30 flow into the channel 22 through the openings 22A. In one or more embodiments, the fluidic molding material 30 flows into the channel 22 due to hydrostatic behavior. In some embodiments, the dimension of the opening 22A is larger than the size of the filler of the fluidic molding material 30 such that the filler can fill the channel 22 through the opening 22A. In some embodiments, the ratio of the dimension of the opening 22A to the size of the filler is greater than 1.5, or greater than 2, or greater than 3, or even more. By way of example, the size (e.g. diameter) of the filler is about 20 micrometers, and the dimension (e.g. length or width) is about 50 micrometers. In one or more embodiments, the channel 22 is positioned in the fluidic molding material 30 at a first depth D1 such that a first portion 22L of each of the openings 22A is immersed into the fluidic molding material 30, while a second portion 22U of each of the openings 22A is not immersed into the fluidic molding material 30. Accordingly, the fluidic molding material 30 is able to flow into the channel 22 through the first portion 22L of the opening 22A, while residual air in the channel 22 is able to be exhausted from the second portion 22U of the opening 22A. In one or more embodiments, the reaction chamber 40 is vacuumed during immersing the stacked structure 20 into the fluidic molding material 30 such that the residual air in the channel 22 is able to be exhausted by vacuum 42. In one or more embodiments, the fluidic molding material 30 is heated when immersing the stacked structure 20 into the molding material 30 to maintain fluidity of the fluidic molding material 30.

Figure 3F:
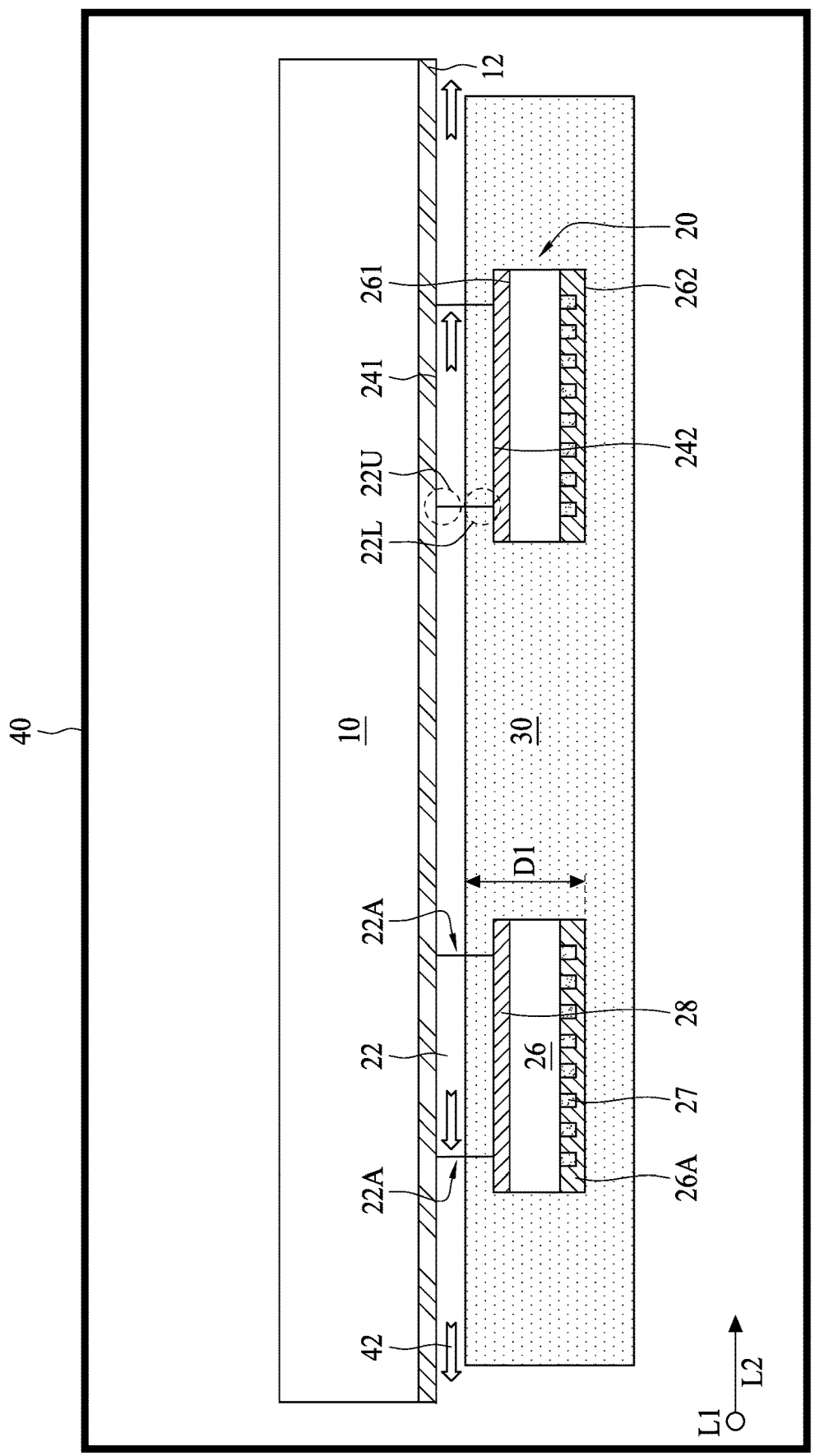

As depicted in FIG. 3F, the fluidic molding material 30 continues to flow into the channel 22 through the first portion 22L of the opening 22A, while the residual air in the channel 22 is still being exhausted from the second portion 22U of the opening 22A.

Figure 3G:
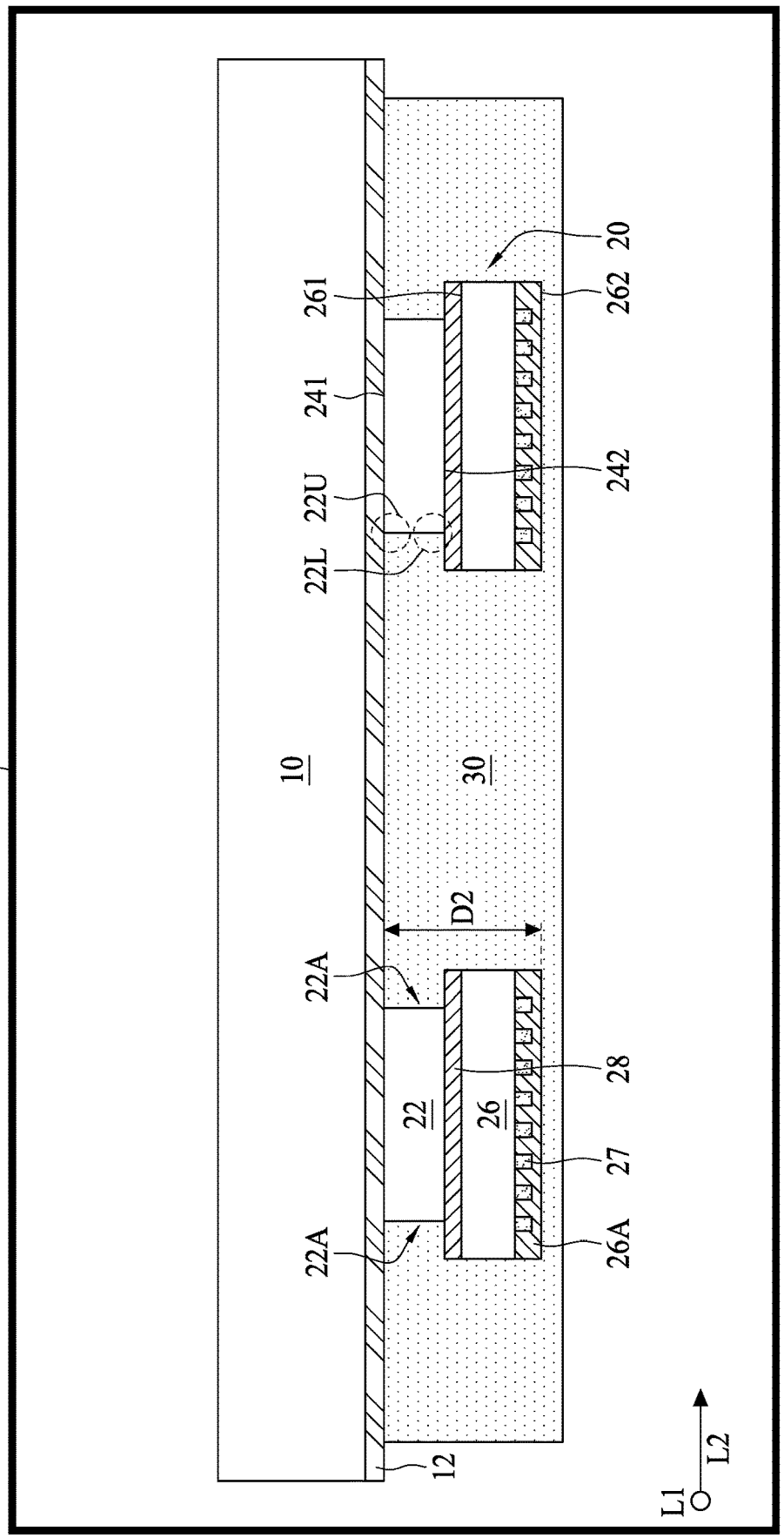

As depicted in FIG. 3G, the channel 22 is subsequently positioned in the fluidic molding material 30 at a second depth D2 such that the second portion 22U of each of the openings 22A is further immersed into the fluidic molding material 30. As the residual air is exhausted from the reaction chamber 40, the fluidic molding material 30 is able to flow into the channel 22 through the second portion 22U of the openings 22A until the channel 22 is filled up.

In one or more embodiments, the channel 22 is immersed into the fluidic molding material 30 in a continuous manner at a substantially constant rate. By way of example, the channel 22 is lowered toward the fluidic molding material 30 continuously at a proper lowering rate (or the fluidic molding material 30 is lifted toward the channel 22 continuously at a proper lifting rate) such that the fluidic molding material 30 has sufficient time flowing into the channel 22 through the first portion 22L of the opening 22A, the residual air in the channel 22 is able to be exhausted from the second portion 22U of the opening 22A, and then the fluidic molding material 30 is able to fill the channel 22 through the second portion 22U of the openings 22A. In one or more embodiments, the channel 22 is immersed into the fluidic molding material 30 in a multi-step manner. By way of example, the channel 22 is lowered toward the fluidic molding material 30 at a first depth D1 and maintained at the first depth D1 such that the fluidic molding material 30 has sufficient time flowing into the channel 22 through the first portion 22L of the opening 22A, and the residual air in the channel 22 is able to be exhausted from the second portion 22U of the opening 22A. The channel 22 is then lowered toward the fluidic molding material 30 at a second depth D2 and maintained at the second depth D2 such that the fluidic molding material 30 is able to fill the channel 22 through the second portion 22U of the openings 22A.

Figure 3H:
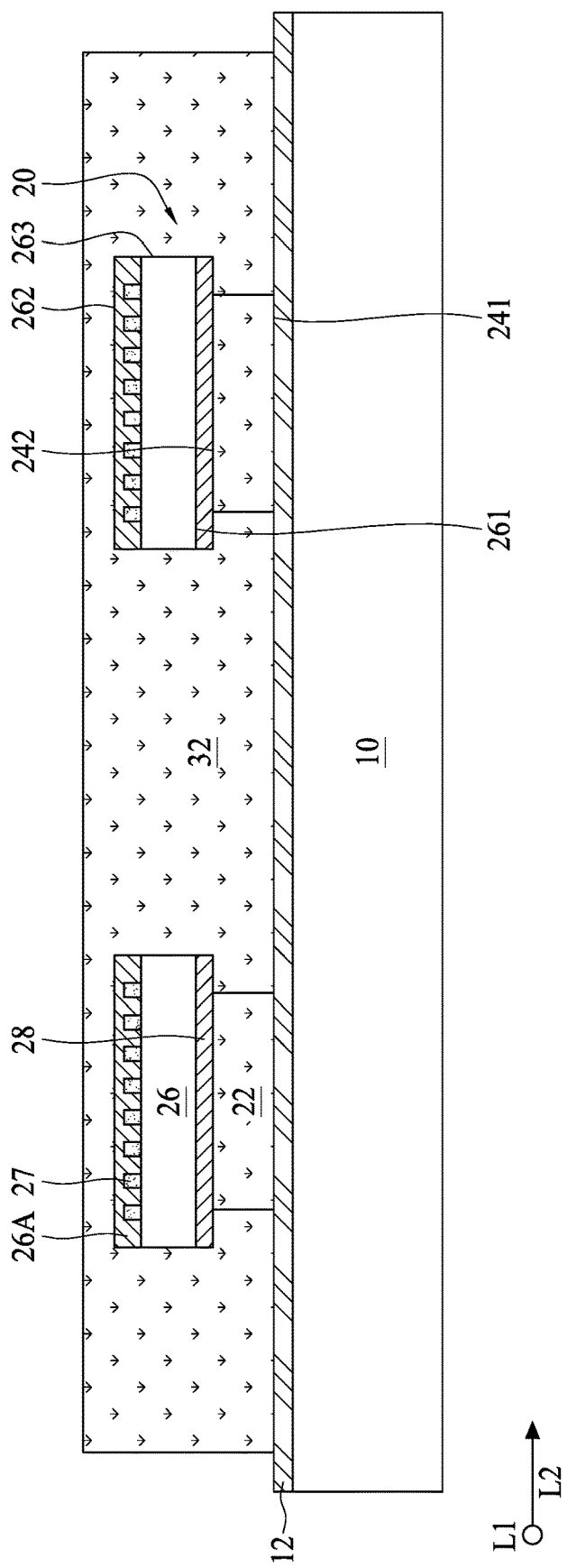
Figure 3I:
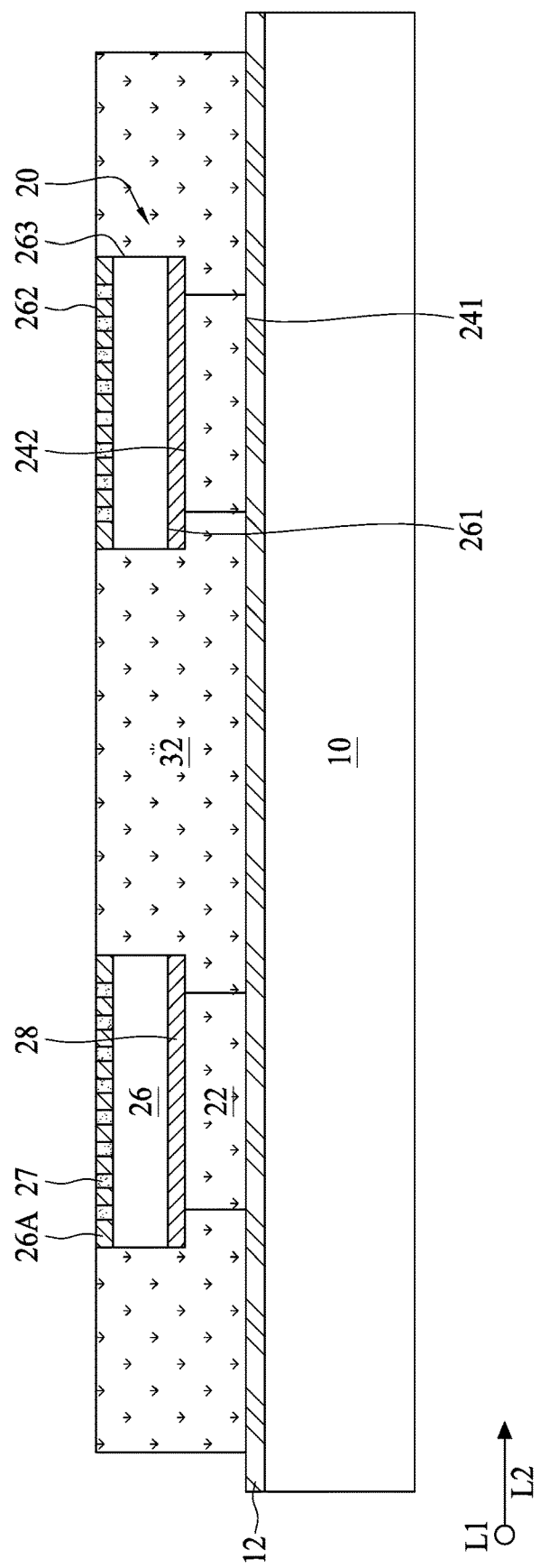

As depicted in FIG. 3H, the fluidic molding material 30 may be then cured to form a molding layer 32 in the channel 22. As depicted in FIG. 3I, a portion of the molding layer 32 is removed by e.g., grinding to expose the conductors 27 electrically connected to the second die 26 and the conductors (not shown) electrically connected to the first die (not shown). Accordingly, a semiconductor package structure 1 is formed. In one or more embodiments, an electronic structure (not shown) such as a redistribution layer is formed over the second die 26 and electrically connected to the conductors 27. In one or more embodiments, the molding layer 32 further covers an edge 263 of the second die 26. In one or more embodiments, the molding layer 32 further covers a portion of the second surface and an edge of the first die. In one or more embodiments, the molding layer 32 in the channel 22, covering the first dies (not shown) and the second die 26 is formed by one time immersion molding operation. Thus, manufacturing costs can be reduced. In one or more embodiments, the carrier substrate 10 is removed from the stacked structure 20 after the molding layer 32 is formed.

The semiconductor package structure of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 4A:
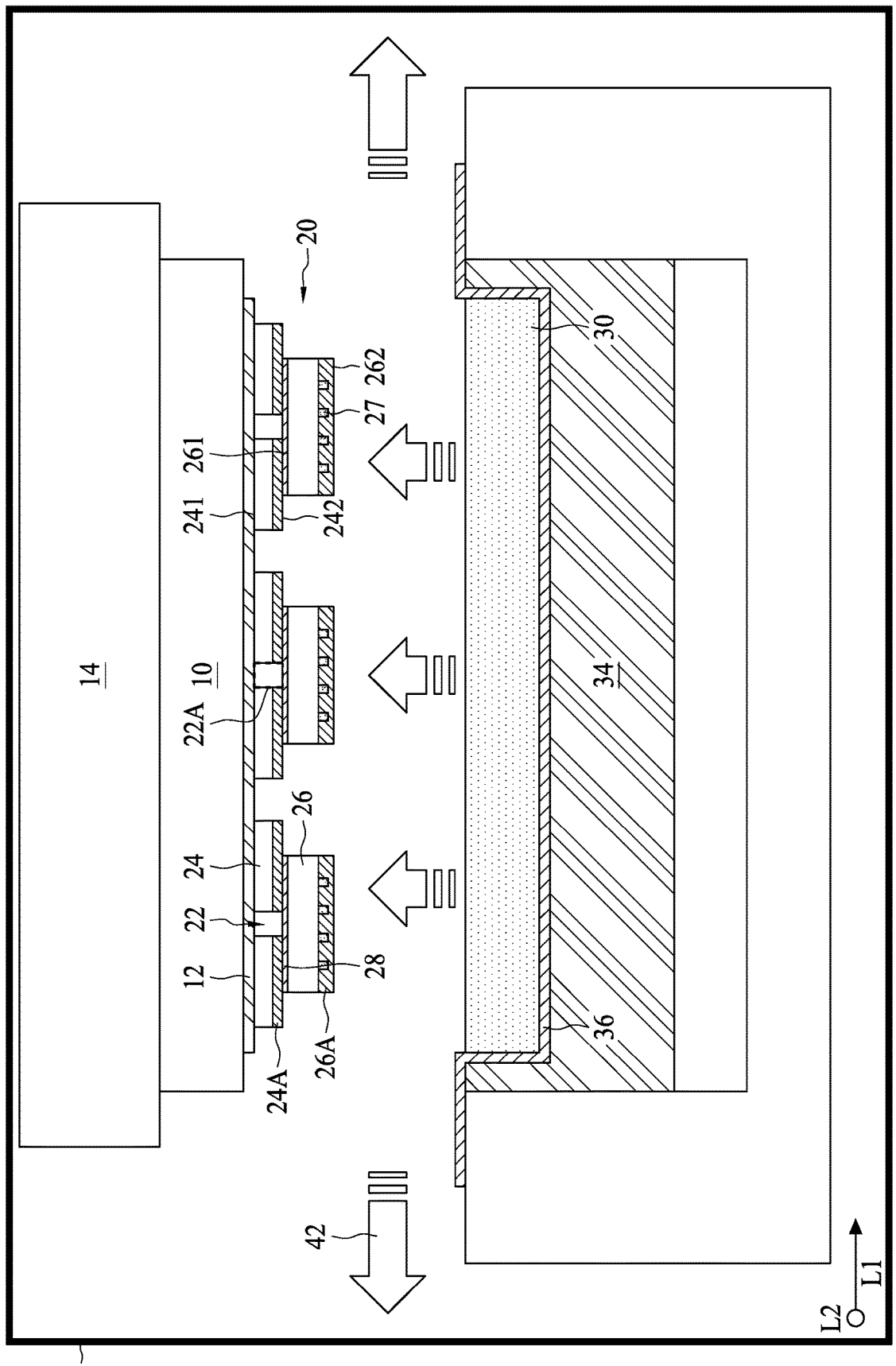
FIG. 4A, FIG. 4B, FIG. 4C and FIG. 4D are schematic views at one of various operations of manufacturing a semiconductor package structure according to one or more embodiments of the present disclosure.

FIG. 4A, FIG. 4B, FIG. 4C and FIG. 4D are schematic views at one of various operations of manufacturing a semiconductor package structure according to one or more embodiments of the present disclosure. As depicted in FIG. 4A, a carrier substrate 10 is provided. A stacked structure 20 is formed over the carrier substrate 10. The stacked structure 20 has a channel 22 with at least one opening 22A. In one or more embodiments, the stacked structure 20 includes several first dies 24 disposed over the carrier substrate 10 and spaced from each other with the channel 22. In one or more embodiments, a first surface (e.g. a bottom surface) 241 of the first die 24 is formed over the carrier substrate 10 with an adhesive layer 12 such as a die attaching film (DAF). The first dies 24 may be semiconductor dies or any other types of dies, package structures or interposers. The stacked structure 20 further includes at least one second die 26 over a second surface (e.g. an upper surface) 242 of the first dies 24. In one or more embodiments, the second die 26 is formed over the first dies 24 with another adhesive layer 28 such as a die attaching film (DAF). The second die 26 also covers the channel 22 such that the carrier substrate 10, the first dies 24 and the second die 26 define the channel 22 with the at least two openings 22A. The second die 26 may be a semiconductor die or any other types of dies or package structures. In one or more embodiments, the second die 26 is in electrical communication with the first dies 24. In one or more embodiments, conductors such as conductive bumps or conductive pillars are disposed between and electrically connected to the second die 26 and the first die(s) 24.

In one or more embodiments, a fluidic molding material 30 is contained in a mold chase 34. In one or more embodiments, the mold chase 34 is equipped with heater to heat the fluidic molding material 30 to maintain fluidity of the fluidic molding material 30. In one or more embodiments, a release film 36 is formed on the mold chase 34 to help release the molding layer formed after molding. In one or more embodiments, the carrier substrate 10 is fixed on a substrate holder 14. In one or more embodiments, the substrate holder 14 is a chuck such as a vacuum chuck, an electrostatic chuck (E chuck) or any other suitable holder able to handle and carry the carrier substrate 10. In one or more embodiments, the substrate holder 14 may be equipped with heater to heat the stacked structure 20. The stacked structure 20 and the carrier substrate 10 are held by the substrate holder 14 and suspended over the mold chase 34 before immersing the channel 22 into the fluidic molding material 30. In one or more embodiments, the immersion molding operation is performed in a reaction chamber 40 with vacuum function.

Figure 4B:
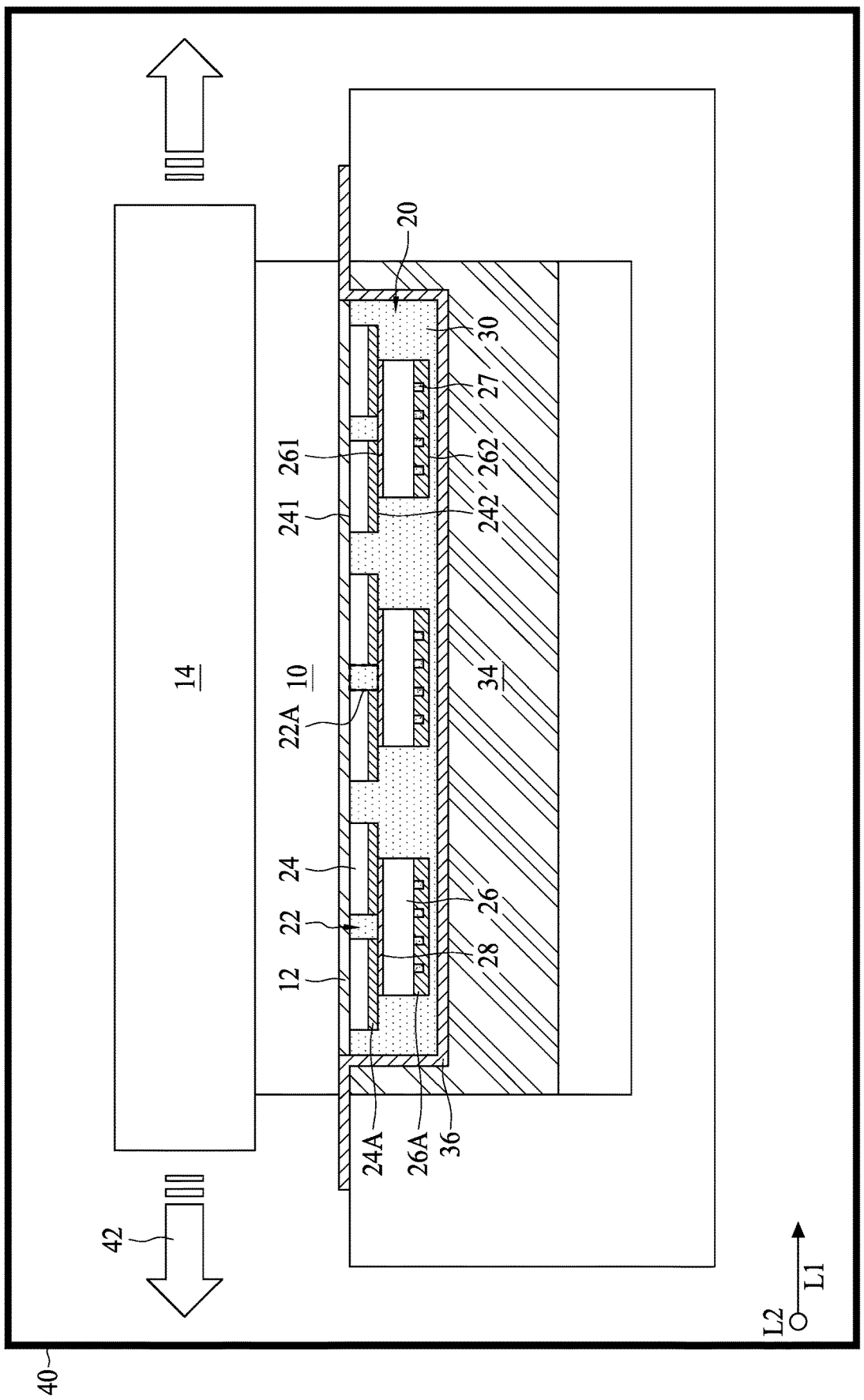

As depicted in FIG. 4B, the stacked structure 20 is immersed into the fluidic molding material 30 to render the fluidic molding material 30 flow into the channel 22. In one or more embodiments, the stacked structure 20 and the carrier substrate 10 held by the substrate holder 14 are moved downward to immerse the channel 22 into the fluidic molding material 30. In one or more embodiments, the mold chase 34 is moved upward to immerse the channel 22 into the fluidic molding material 30. In one or more embodiments, immersion the stacked structure 20 into the fluidic molding material 30 is performed as the operations described in FIG. 3E, FIG. 3F and FIG. 3G, but not limited thereto. In one or more embodiments, the heater in the substrate holder 14 is operated to heat the stacked structure 20 during immersion. In one or more embodiments, the heater in the mold chase 34 is operated to heat the fluidic molding material 30 during immersion. In one or more embodiments, the reaction chamber 40 is vacuumed during immersion.

Figure 4C:
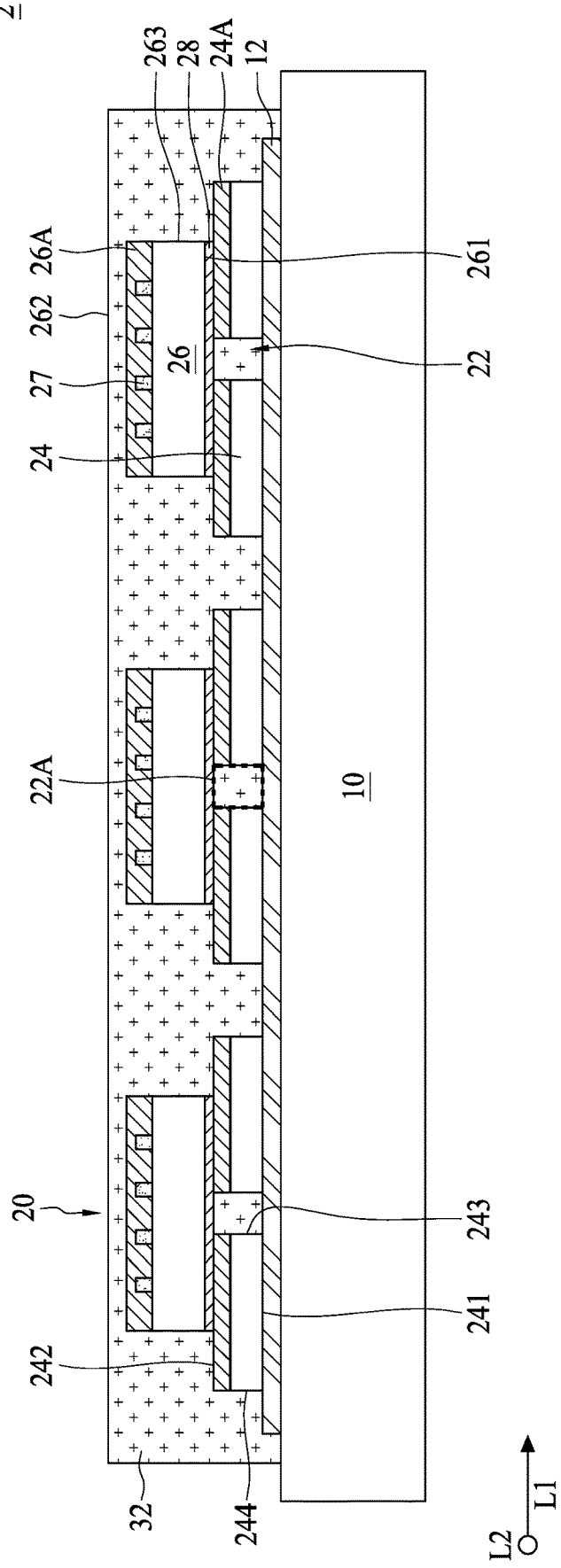
Figure 4D:
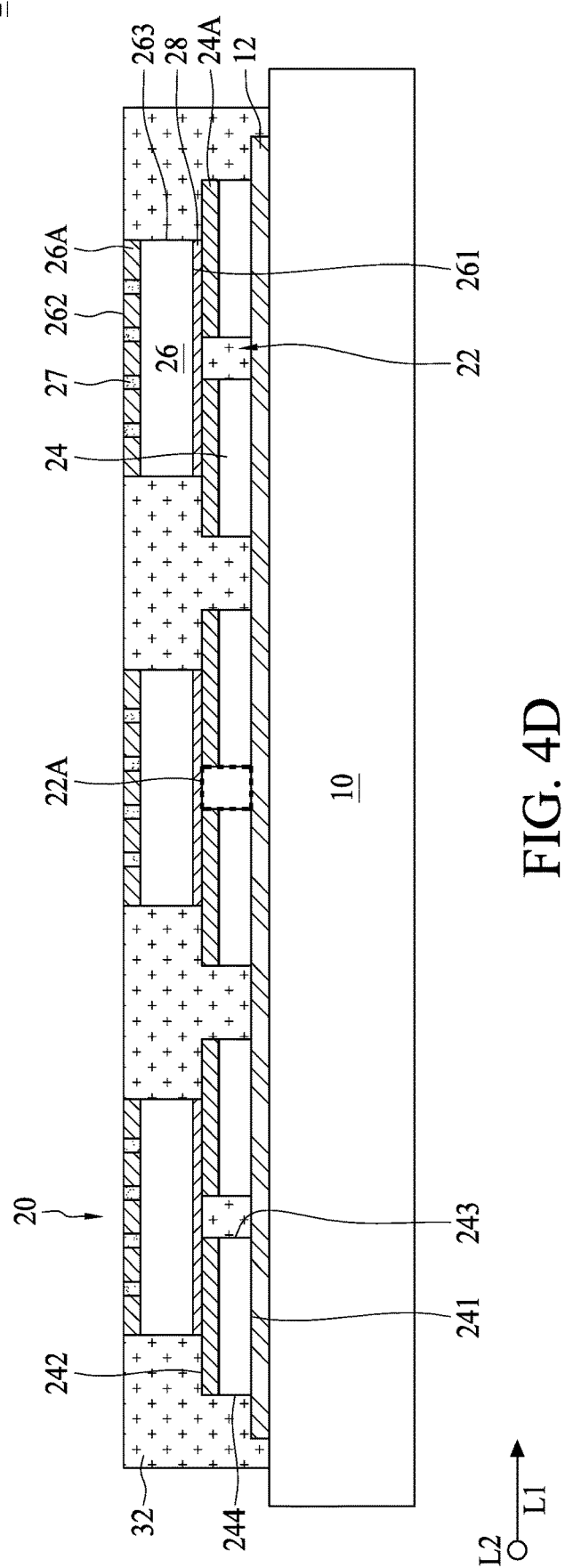

As depicted in FIG. 4C, the fluidic molding material 30 is then cured to form a molding layer 32 in the channel 22. As depicted in FIG. 4D, a portion of the molding layer 32 is removed by e.g., grinding to expose the conductors 27 electrically connected to the second die 26 and the conductors (not shown) electrically connected to the first die 24. Accordingly, a semiconductor package structure 2 is formed. In one or more embodiments, an electronic structure (not shown) such as a redistribution layer is formed over the second die 26 and electrically connected to the conductors 27. In one or more embodiments, the molding layer 32 further covers an edge 263 of the second die 26. In one or more embodiments, the molding layer 32 further covers a portion of the second surface 242 and an outer sidewall 244 of the first die 24. In one or more embodiments, the molding layer 32 in the channel 22, covering an outer sidewall 263 of the second die 26 and a portion of the second surface 242 and the outer sidewall 244 of the first die 24 is formed by one time immersion molding operation. Thus, manufacturing costs can be reduced. In one or more embodiments, the carrier substrate 10 is removed from the stacked structure 20 after the molding layer 32 is formed.

Figure 5A:
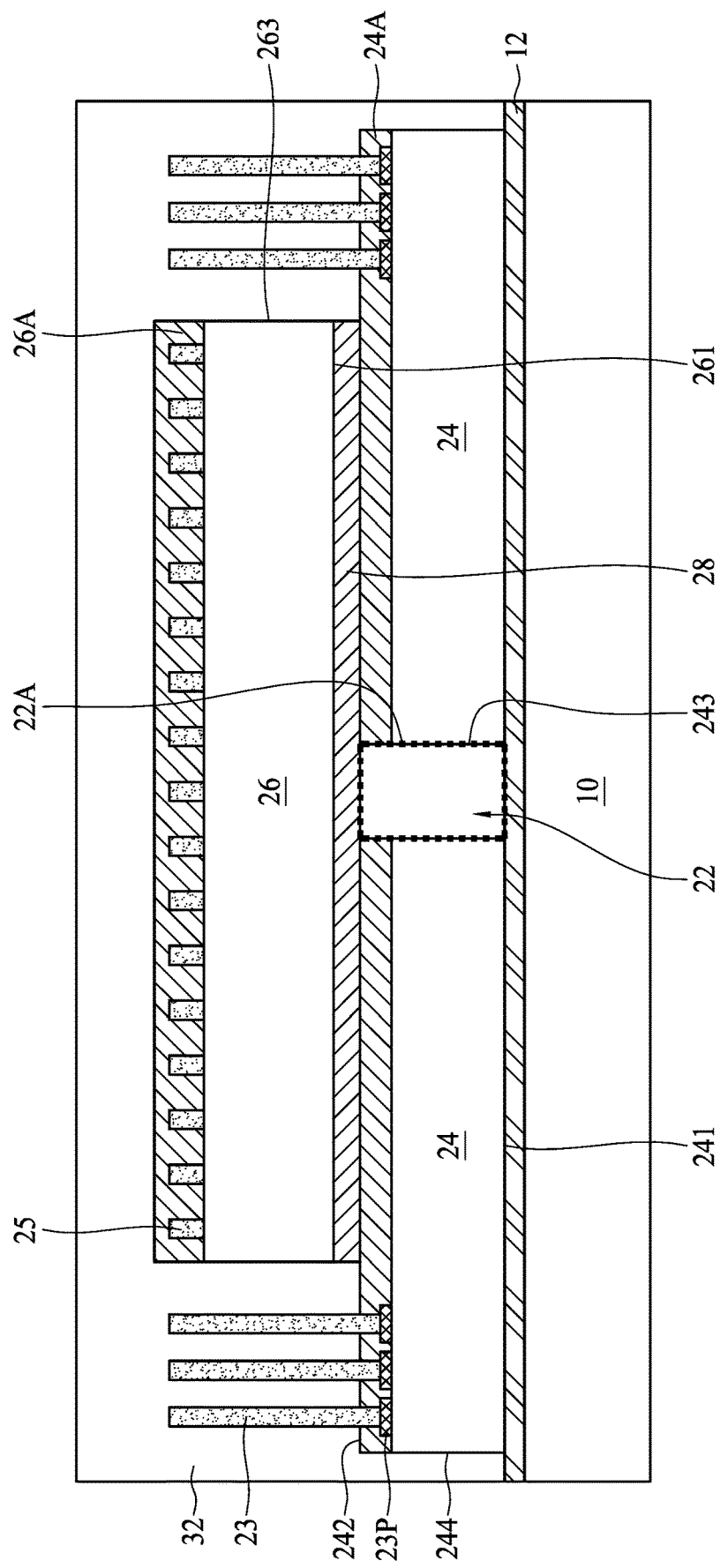
FIG. 5A, FIG. 5B, FIG. 5C and FIG. 5D are schematic views at one of various operations of manufacturing a semiconductor package structure according to one or more embodiments of the present disclosure.

FIG. 5A, FIG. 5B, FIG. 5C and FIG. 5D are schematic views at one of various operations of manufacturing a semiconductor package structure 3 according to one or more embodiments of the present disclosure. As depicted in FIG. 5A, a stacked structure 20 formed over a carrier substrate 10 is provided. In some embodiments, the stacked structure 20 includes several first dies 24, a second die 26, several first conductors 23 and several second conductors 25. The second die 26 is positioned over the first dies 24, defining a channel 22 with at least one opening 22A. The first conductors 23 are disposed over and electrically connected to the first dies 24. In some embodiments, the first conductors 23 includes through insulator vias (TIVs) disposed over the structural layer 24A of the first die 24 and arranged alongside the second die 26. In some embodiments, the first conductors 23 are electrically connected to the first dies 24 through respective bonding pads 23P. The second conductors 25 are disposed over and electrically connected to the second die 26. In some embodiments, the second conductors 25 such as conductive pillars or bonding pads are disposed proximal to the second surface 262 of the second die 26.

In some embodiments, a molding layer 32 is formed to fill the channel 22 by an immersion molding operation as described in the foregoing embodiments. In some embodiments, the molding layer 32 further surrounds the first dies 24, the second die 26, the first conductors 23 and the second conductors 25.

Figure 5B:
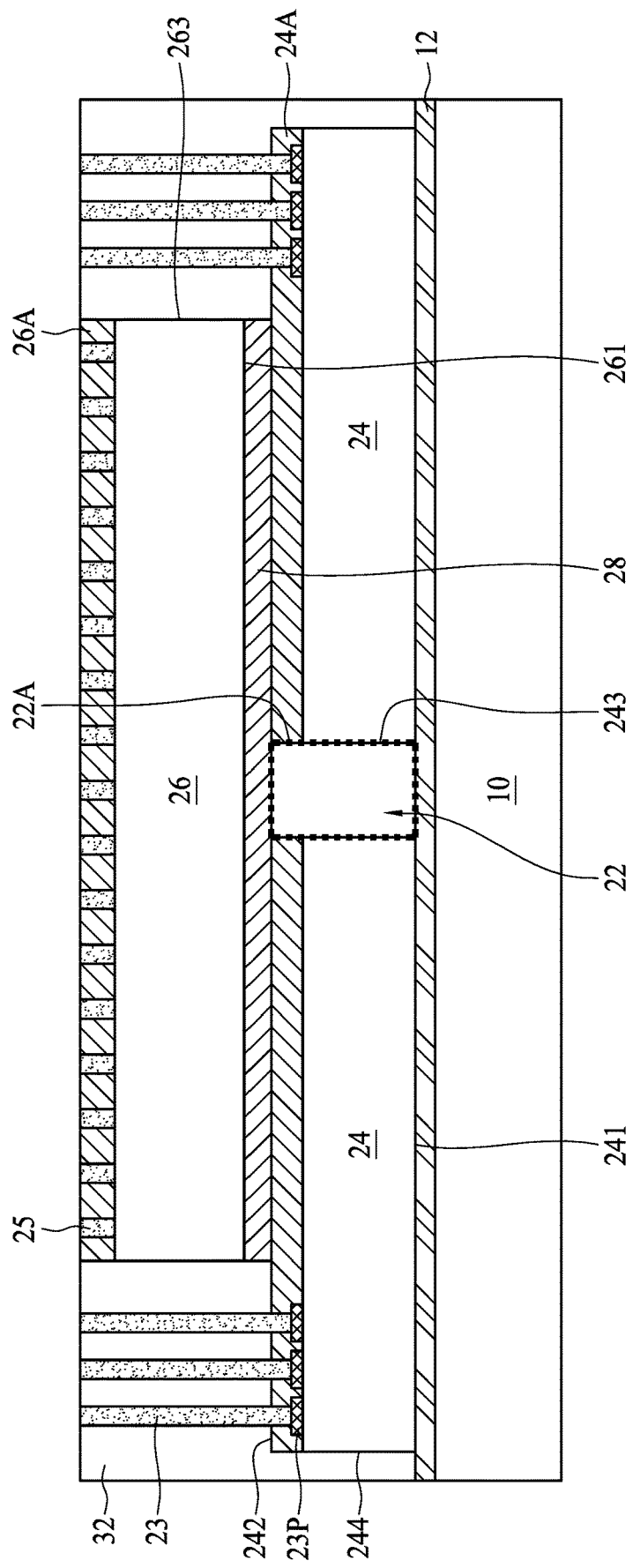

As depicted in FIG. 5B, a portion of the molding layer 32 and the structural layer 26A are removed by, e.g. grinding to expose a portion of the first conductors 23 and a portion of the second conductors 25.

Figure 5C:
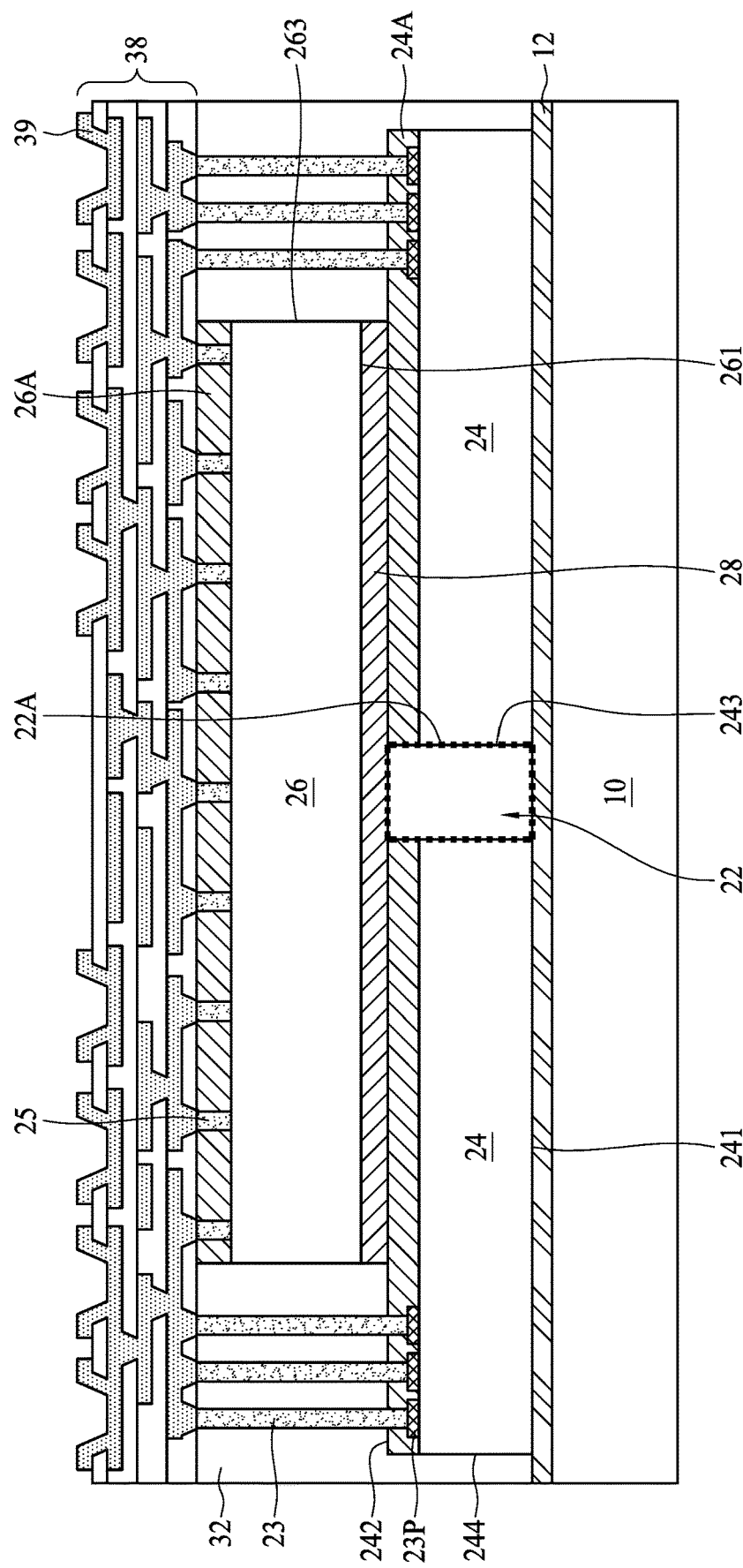

As depicted in FIG. 5C, a redistribution layer 38 is formed over the molding layer 32. In some embodiments, the first conductors 23 and the second conductors 25 are electrically connected to each other through the redistribution layer 38, and thus the first dies 24 and the second die 26 are in electrical communication with each other through the first conductors 23, the redistribution layer 38 and the second conductors 25. In some embodiments, conductive pads 39 such as under bump metallurgies (UBMs) or the like are formed over and electrically connected to the redistribution layer 38.

Figure 5D:
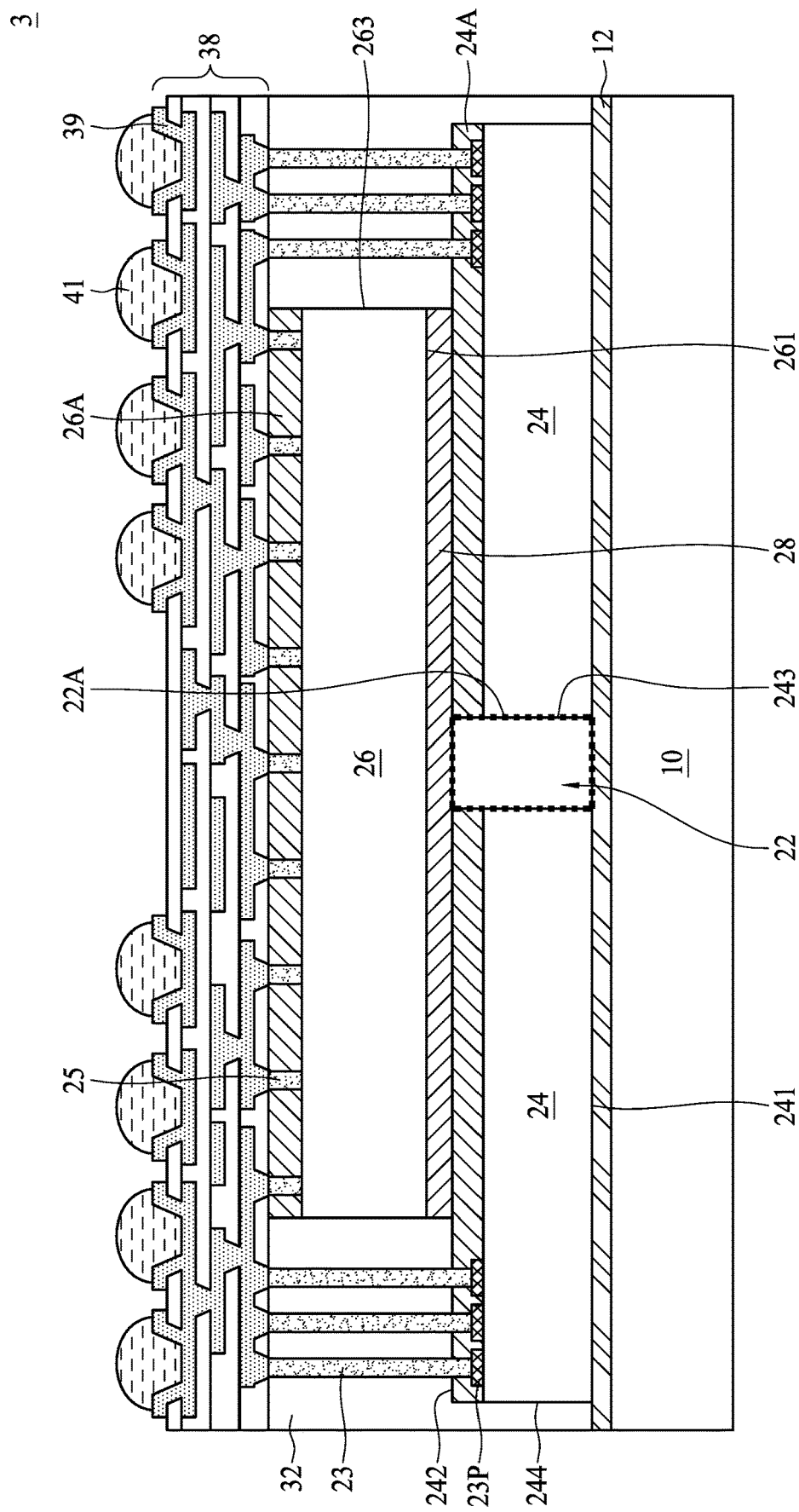

As depicted in FIG. 5D, conductive structures 41 such as conductive bumps or the like are formed over and electrically connected to the conductive pads 39 to form a semiconductor package structure 3. In some embodiments, an electronic structure such as a package structure, a circuit board or the like can be formed over and electrically connected to the redistribution layer 38 through the conductive structures 41 and the conductive pads 39.

Figure 6:
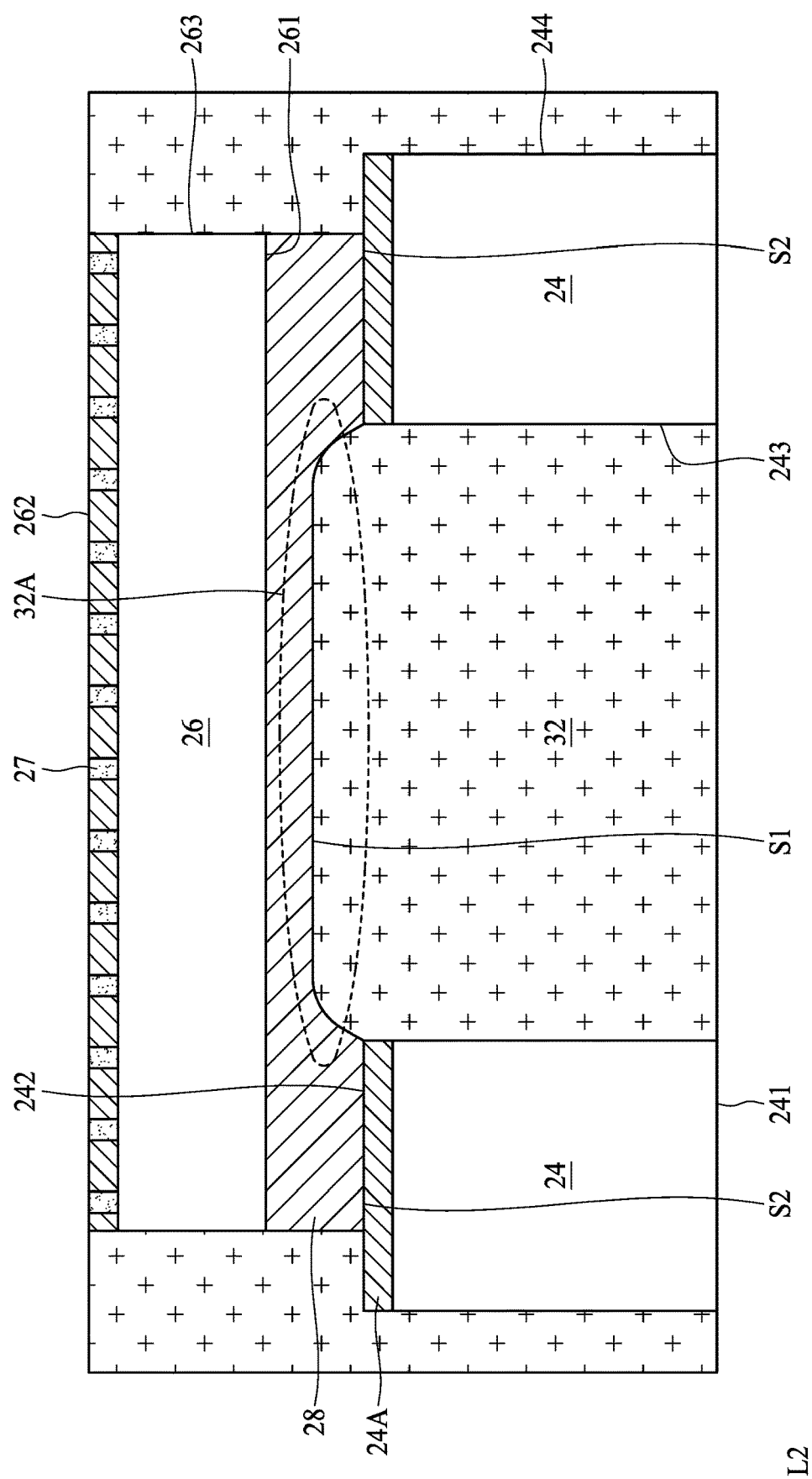
FIG. 6 is a schematic cross-sectional view of a semiconductor package structure according to one or more embodiments of the present disclosure.

FIG. 6 is a schematic cross-sectional view of a semiconductor package structure 4 according to one or more embodiments of the present disclosure. As depicted in FIG. 6, the semiconductor package structure 3 includes several first dies 24, a molding layer 32, a second die 26 and an adhesive layer 28. The first dies 24 are spaced from each other. The molding layer 32 is disposed between the first dies 24. The second die 26 is disposed over the first dies 24 and the molding layer 32. The adhesive layer 28 is disposed between the first dies 24 and the second die 26, and between the molding layer 32 and the second die 26. In one or more embodiments, an upmost layer of the first die 24 is a structural layer 24A such as an upmost layer of a redistribution layer (RDL), an upmost passivation layer or other insulative or conductive layer of the first die 24. A first interface S1 is located between adhesive layer 28 and the molding layer 32, and a second interface S2 is located between the adhesive layer 28 and the first dies 24. In one or more embodiments, the second interface S2 is located between the adhesive layer 28 and the structure layer 24A of the first dies 24.

In one or more embodiments, the molding layer 32 is formed subsequent to formation of the first dies 24 and the second die 26, and thus the first interface S1 and the second interface S2 are located at different levels due to different material characteristics between the molding layer 32 and the adhesive layer 28. In one or more embodiments, the adhesive layer 28 is softer than the molding layer 32, and therefore the molding layer 32 includes a protrusion portion 32A extending toward the second die 26. Accordingly, the first interface S1 is closer to the second die 26 than the second interface S2.

Figure 7:
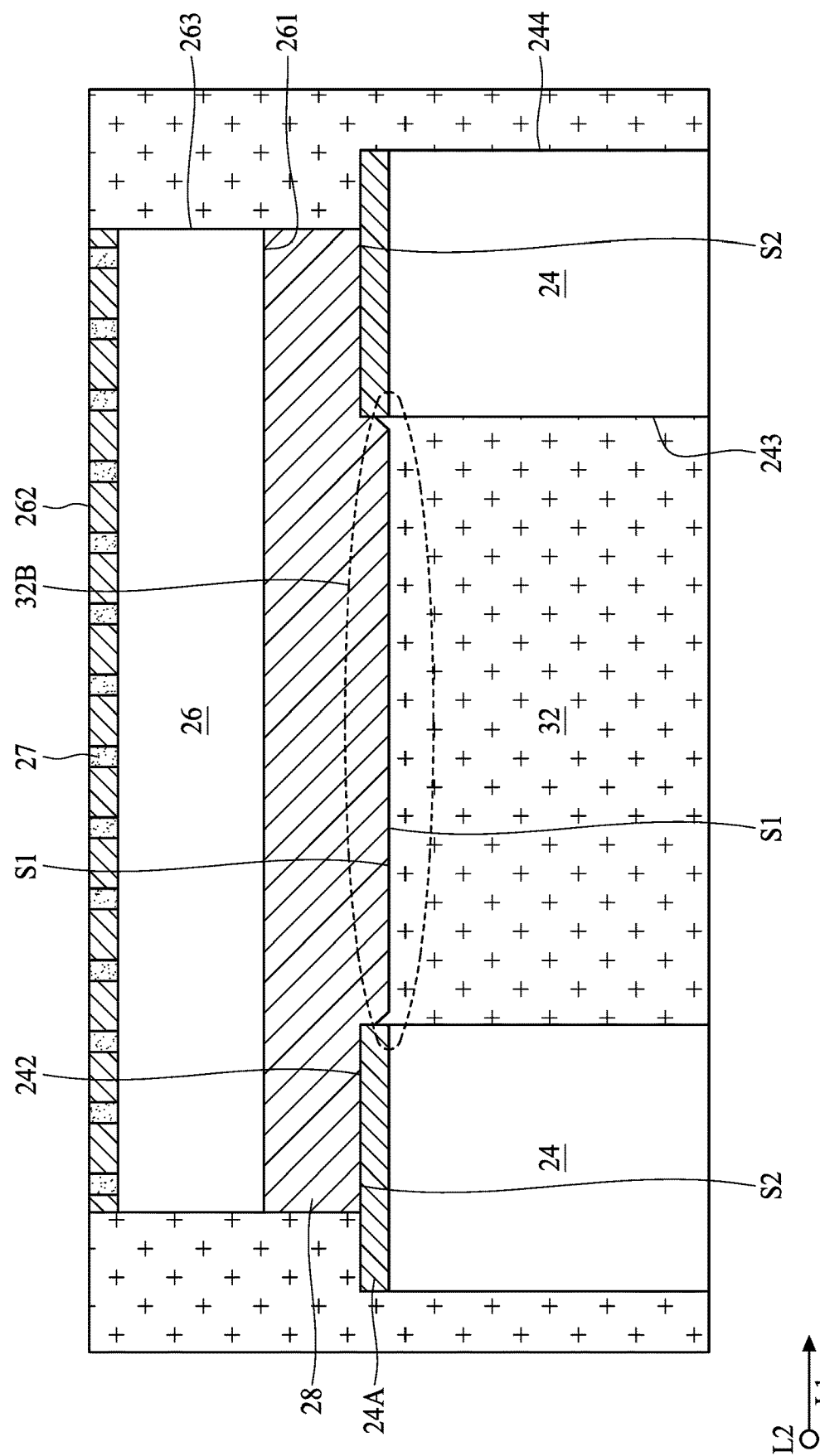
FIG. 7 is a schematic cross-sectional view of a semiconductor package structure according to one or more embodiments of the present disclosure.

FIG. 7 is a schematic cross-sectional view of a semiconductor package structure 5 according to one or more embodiments of the present disclosure. As depicted in FIG. 7, different from the semiconductor package structure 4 in FIG. 6, the molding layer 32 is softer than the adhesive layer 28, and therefore the molding layer 32 includes a recessed portion 32B recessed away from the second die 26. Accordingly, the first interface S1 is farther to the second die 26 than the second interface S2.

In one or more embodiments of the present disclosure, the molding layer of the semiconductor package structure is formed by an immersion molding operation. The immersion molding operation is configured to reduce occurrence of void in the channel structure of the semiconductor package structure. The method is able to form a molding layer in a channel and encapsulating the stacked dies of the semiconductor package structure by one immersion molding operation, and thus manufacturing costs are reduced.

In one exemplary aspect, a method of manufacturing a semiconductor package structure is provided. A stacked structure formed over a carrier substrate is provided. The stacked structure comprises a plurality of first dies over the carrier substrate and spaced from each other, and a second die over the first dies, and the carrier substrate, the first dies and the second die define a channel with an opening. The stacked structure is immersed into a fluidic molding material to render the fluidic molding material flow into the channel through the openings.

In another aspect, a semiconductor package structure includes a plurality of first dies, a molding layer, a second die and an adhesive layer. The first dies are spaced from each other. The molding layer is between the first dies. The second die is over the plurality of first dies and the molding layer. The adhesive layer is between the plurality of first dies and the second die, and between the molding layer and the second die. A first interface is between adhesive layer and the molding layer and a second interface is between the adhesive layer and the first dies are at different levels.

In yet another aspect, a semiconductor package structure includes a plurality of first dies, a second die, a molding layer, a plurality of first conductors, a plurality of second conductors and a redistribution layer. The first dies are spaced from each other. The second die is over the plurality of first dies. The first die and the second die define a channel with an opening. The molding layer surrounds the first dies and the second die, and in the channel. The first conductors are in the molding layer, and over and electrically connected to the first dies. The second conductors are in the molding layer, and over and electrically connected to the second die. The redistribution layer is over the molding layer, wherein the first conductors and the second conductors are electrically connected to each other through the redistribution layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
   a plurality of first dies spaced from each other;
   a molding layer between the first dies;
   a second die over the plurality of first dies and the molding layer; and
   an adhesive layer between the plurality of first dies and the second die, and between the molding layer and the second die,
   wherein a first interface between the adhesive layer and the molding layer and a second interface between the adhesive layer and the plurality of first dies are at different levels, wherein the molding layer includes a protrusion portion extending toward the second die, and the first interface is closer to the second die than the second interface.

2. The semiconductor package structure of claim 1, further comprising a plurality of conductors over an upper surface of the second die, and the molding layer exposes the conductors.

3. The semiconductor package structure of claim 2, further comprising a redistribution layer over the upper surface of the second die and electrically connected to the plurality of conductors.

4. The semiconductor package structure of claim 1, wherein the molding layer further covers a portion of an upper surface and an outer sidewall of the first die, and an outer sidewall of the second die.

5. The semiconductor package structure of claim 1, wherein the molding layer is engaged with the adhesive layer.

6. The semiconductor package structure of claim 1, wherein the first dies each comprises a semiconductor die.

7. The semiconductor package structure of claim 6, wherein the first dies each further comprises a structural layer.

8. A semiconductor package structure, comprising:
- a plurality of first dies spaced from each other;
- a second die over the plurality of first dies, the plurality of first dies and the second die defining a channel with an opening facing a lateral direction;
- a molding layer in the channel and extending to surround the plurality of first dies and the second die through the opening; and
- an adhesive layer between the plurality of first dies and the second die, and between the molding layer and the second die,
- wherein a first interface between the adhesive layer and the molding layer and a second interface between the adhesive layer and the plurality of first dies are at different levels, wherein the molding layer includes a protrusion portion extending toward the second die, and the first interface is closer to the second die than the second interface.

9. The semiconductor package structure of claim 8, further comprising a plurality of first conductors in the molding layer, and over and electrically connected to the first dies.

10. The semiconductor package structure of claim 9, further comprising a plurality of second conductors in the molding layer, and over and electrically connected to the second die.

11. The semiconductor package structure of claim 10, further comprising a redistribution layer over the molding layer, wherein the first conductors and the second conductors are electrically connected to each other through the redistribution layer.

12. A semiconductor package structure, comprising:
- a plurality of first dies spaced from each other;
- a second die over the plurality of first dies, the plurality of first dies and the second die defining a channel with at least one opening facing a lateral direction;
- a molding layer in the channel, and extending to surround the plurality of first dies and the second die through the opening;
- an adhesive layer between the plurality of first dies and the second die, and between the molding layer and the second die, wherein a first interface between the adhesive layer and the molding layer and a second interface between the adhesive layer and the plurality of first dies are at different levels;
- a plurality of first conductors in the molding layer, and over and electrically connected to the first dies;
- a plurality of second conductors in the molding layer, and over and electrically connected to the second die; and
- a redistribution layer over the molding layer, wherein the first conductors and the second conductors are electrically connected to each other through the redistribution layer,
- wherein the molding layer includes a protrusion portion extending toward the second die such that the first interface is closer to the second die than the second interface.

13. The semiconductor package structure of claim 1, wherein the adhesive layer comprises a die attaching film.

14. The semiconductor package structure of claim 8, wherein the molding layer is engaged with the adhesive layer.

15. The semiconductor package structure of claim 8, wherein the first dies each comprises a semiconductor die.

16. The semiconductor package structure of claim 8, wherein the first dies each further comprises a structural layer.

17. The semiconductor package structure of claim 8, wherein the adhesive layer comprises a die attaching film.

18. The semiconductor package structure of claim 12, wherein the molding layer is engaged with the adhesive layer.

19. The semiconductor package structure of claim 12, wherein the first dies each comprises a semiconductor die.

20. The semiconductor package structure of claim 12, wherein the first dies each further comprises a structural layer.

* * * * *